United States Patent
Garnett

[19]

[11] Patent Number: 5,903,233
[45] Date of Patent: May 11, 1999

[54] EXTENDED BINARY APPARATUS AND METHOD

[75] Inventor: Paul Jeffrey Garnett, Merseyside, United Kingdom

[73] Assignee: Sun Microsystems, Inc., Mountain View, Calif.

[21] Appl. No.: 08/882,194

[22] Filed: Jun. 25, 1997

[51] Int. Cl.⁶ .................................................. H03M 7/12
[52] U.S. Cl. ........................................................ 341/84
[58] Field of Search .............................. 341/84, 85, 87, 341/95, 56

[56] References Cited

U.S. PATENT DOCUMENTS 4,011,559  3/1977  Sharp et al. ............................. 341/87
4,118,699  10/1978  Comer ...................................... 341/84

*Primary Examiner*—Brian Young
*Attorney, Agent, or Firm*—Blakely Sokoloff Taylor & Zafman

[57] ABSTRACT

An extended binary encoding for a plurality of inputs is sensed using a two-phase process. In a first phase binary values are sensed at the inputs. In the second phase, inputs sensed as having a first binary signal value are driven to a second binary value to test whether other inputs which had the first binary signal value also change to the second binary value indicative of a direct connection between the inputs. Accordingly, an enhanced binary encoding is achieved by evaluating not only the binary signal value at the inputs, but also which inputs are connected together, the selective interconnection of inputs extending the $2^N$ options available for conventional binary encoding.

32 Claims, 5 Drawing Sheets

EXTENDED BINARY APPARATUS AND METHOD

BACKGROUND AND INTRODUCTION

This invention relates to binary input devices and methods.

In many digital systems, different configurations are required, where the particular configuration needs to be sensed by the digital system. If a large number of configurations is required, a binary encoding may be used where the number of options available is $2^N$, wherein N is the number of pins used. As the name suggests, binary systems have only two possible values per pin (usually high and low).

Often, configuration options for hardware are encoded using jumpers, the number of options being determined by the number of option pins. Often the number of pins available on an integrated circuit is at a premium due to cost and/or functionality requirements.

Three level (trinary or tri-state) encoding is known, where each pin has three possible values, namely high, low and mid. The electronic circuitry required to sense trinary levels is more complex than that required to sense binary levels. However, a disadvantage of trinary encoding systems is that the encoding has a base of three, whereas most digital systems operate on a base of two (i.e. binary). This leads to undesirable technical complexities as well as difficulties for users not used to working to base three, as well as the need for additional level discriminating circuitry.

Accordingly, the invention seeks to provide an enhanced encoding which can provide more options than conventional binary encoding without the need for the tri-level discriminating circuitry required for trinary encoding.

SUMMARY OF THE INVENTION

An aim of the invention is to provide more options than are afforded by conventional binary encoding without the need for tri-level discriminating circuitry.

The invention provides an extended binary encoding for a plurality of inputs, which encoding is sensed using a two-phase process. In a first phase binary values are sensed at the inputs. In a second phase, inputs sensed as having a first binary signal value are driven to a second binary value to test whether other inputs which had the first binary signal value in the first phase also change to the second binary value, this being indicative of a direct connection between the inputs. Accordingly, an enhanced binary encoding is achieved by evaluating not only the binary signal value at the inputs, but also which inputs are connected together, the selective interconnection of inputs extending the $2^N$ options available for conventional binary encoding.

In accordance with an aspect of the invention, there is provided an extended binary input apparatus comprising a plurality of inputs and input control logic configured to be operable in a two phases, whereby the input control logic is operable in a first phase to detect a predetermined signal level at the inputs, and is operable in a second phase to drive an input having the predetermined signal level to another signal level and to detect a change in signal level at another of the inputs as indicative a connection between the inputs representative of an extended binary encoding.

In accordance with another aspect of the invention, there is provided an extended binary input apparatus comprising a plurality of input stages and input control logic, wherein each input stage comprises:

an input for a binary input signal having first and second binary signal values, an input buffer for buffering a binary signal value at the input; and an output driver responsive to a control signal from the input control logic to drive the input to the second binary signal value; and the input control logic is configured:

during a first phase to be responsive to binary signal values sensed at the input stages; and during a second phase, for an input stage at which the first binary signal value is sensed, to cause the output driver for the input stage to drive the input to the second binary signal value and to respond to the second binary signal value being sensed at one or more other input stage or stages which had the first binary signal value in the first phase as indicative of a connection between the driven and the other input(s) and representative of an extended binary encoding.

In accordance with further aspect of the invention, there is provided an integrated circuit comprising a plurality of pins, a plurality of input stages, each associated with a respective pin, and input control logic, wherein each input stage comprises:

an input buffer for sensing either a first binary signal value or a second binary signal value at the respective pin; and an output driver responsive to a control signal from the input control logic to drive the respective pin to the second binary signal value; and the input control logic is configured:

during a first phase to determine the binary signal values sensed at the input pins; and during a second phase to cause the output driver at selected input stages to drive the respective pins to the second value and to respond to the second binary signal value being sensed at one or more other pins which had the first binary signal value in the first phase as indicative of a connection between the driven and the other input(s) and representative of an extended binary encoding.

The invention also provides software control logic on a data carrier for controlling the input of values to a circuit comprising a plurality of inputs for receiving either a first or a second binary signal value, the control logic being configured to be operable:

in a first phase to record a predetermined signal level sensed at the inputs; and in a second phase to cause an input having the predetermined signal level to be driven to another signal level and to respond to sensing of a change in signal level at another of the inputs as indicative a connection between the inputs representative of an extended binary encoding.

In accordance with a further aspect of the invention, there is provided a method for inputting values to a circuit comprising a plurality of inputs for receiving either a first or a second binary signal value, the method comprising steps of:

a) in a first phase,
  i) sensing the binary signal values at the inputs representative of a binary encoding; and,
b) in a second phase,
  i) driving an input having the first binary signal value in the first phase to the second binary signal value, and
  ii) responding to the second binary signal value sensed at another input or inputs which had the first binary signal value in the first phase as indicative of a connection between the driven and the another input and representative of an extended binary encoding.

Preferably, in the second phase, successive input pins for which a first binary signal value is sensed in the first phase are sequentially driven to the second binary signal value and changes from the first to the second values are sensed as indicative of a connection between the driven and the other input(s) and representative of an extended binary encoding.

In a preferred embodiment each input pin is connected via a respective impedance (typically a resistor) to a first potential supply for supplying the first binary signal value and a selectable connection can be made from the input pins to a second supply potential for selectively supplying the second binary signal value. Preferably also, selectable connection(s) between the inputs (input pins) are provided for the extended binary encoding.

The selectable connection(s) can for example be provided by simple connections, for example jumpers. Such connections can significantly increase the number of connections available at a given number of input pins, for example from 8 to 15 for three input pins. If, in addition unidirectional connections (e.g. diodes) are used instead of or as well as omnidirectional connections (e.g., jumpers) the number of options can be increased still further (e.g., to 36 options from three input pins). Where uni and/or omnidirectional connections are used between input pins, additional sensing and driving circuitry is not required, merely appropriate signal decoding, which can be provided by suitable logic (e.g., embedded software).

As indicated, the jumpers and/or diodes can be simply plugged into appropriate terminals to achieve the desired connections. Alternatively, however, in other embodiments, other input means can be provided, for example printed circuit connections which can be selectively broken or fused, rotary switches, keyboards, etc to achieve the appropriate input connections.

The first signal value can be a high potential value and the second value a low potential value. Alternatively, the first binary signal value can be a low potential value and the second binary signal value a high potential value.

Preferably a mapping function, for example a look-up table, is used to derive an encoded value from the value sensed during the first and second phases.

The first and second phases can be put into effect at power-on or reset of the circuit to detect an initial encoding and at later times if required, in which case the encoding can also be changed after power-on or reset of the circuit.

DESCRIPTION OF THE DRAWINGS

Exemplary embodiments of the invention are described hereinafter, by way of example only, with reference to the accompanying drawings in which.

DESCRIPTION OF THE PREFERRED EMBODIMENT

Figure 1:
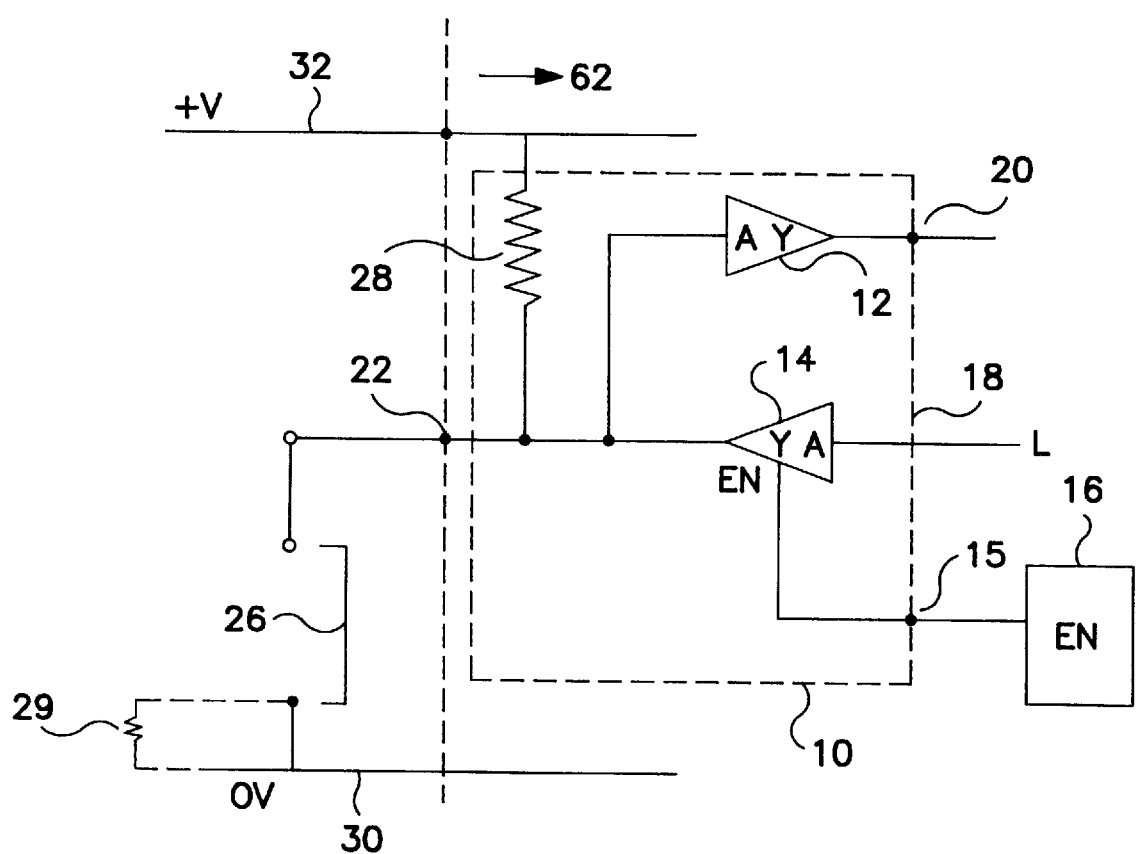
FIG. 1 is a schematic diagram of a binary input stage suitable for receiving extended binary inputs in an embodiment of the invention.

FIG. 1 is a schematic diagram of an input stage 10 suitable for receiving extended-binary inputs. The input stage 10 shown in FIG. 1 can be of known design for enabling both the input and output of binary signal values via a single pin 22. For example, an input stage as shown in FIG. 1 could be provided for input and/or output of binary signals to a microcontroller 62. A binary input signal at the pin 22 is supplied to an input A of an input buffer 12 which can be of conventional design. The output Y from the input buffer 12 is supplied to a terminal 20 of the input stage 10. An output driver 14 is provided which can be selectively enabled by an enable signal supplied at a terminal 15 of the input stage from a source 16 of enabling signals EN (for example a register, or register bit). An output signal L for the pin 22 is supplied at 18 to the input A of the output driver 14.

With a circuit construction as shown in FIG. 1, input signals can be received by the pin 22 and output signals can be supplied via the pin 22 under the control of an enabling signal EN from the source 16.

Typically, in order to supply external first and second binary signal values to the pin 22, an arrangement is provided for supplying either a high value or a low value to the input terminal 22. An example of a possible arrangement is represented schematically in FIG. 1. As shown in FIG. 1, an impedance, or electrically resistive element (here a resistor) 28 is connected between the pin 22 and a first potential source 32 (e.g. a high voltage rail). In addition, the pin 22 is selectively connectable via a lower impedance path to a second potential source 30 (e.g. a low voltage rail). The connection to the second potential source 30 can be, for example, by means of a jumper 26. When the jumper 26 is absent, the input pin 22 assumes a first binary signal value representative of the first potential source 32 via the impedance 28. When the jumper 26 is present, the input pin 22 assumes a second binary signal value representative of the second potential value 30.

As shown in FIG. 1, the first potential source is a high voltage rail 32 and the second potential source is a low voltage rail 30, whereby the first binary signal value is a high signal value and the second binary signal value is a low signal value. However, it will be appreciated that this is only one option. For example, the first and second potential sources could be inverted whereby the first potential source 32 is a low voltage rail and the second potential source 30 is a high voltage rail. Alternatively, rather than providing a direct connection between the pin 22 and the second potential source, when the jumper 26 is present, a further impedance element 29 (e.g. a resistor) having a smaller impedance value than the impedance 28 could replace the direct connection between the jumper 26 and the second potential source 30 in order to determine the second binary value by means of a voltage divider comprising the impedance 28 and the optional impedance 29.

Figure 2:
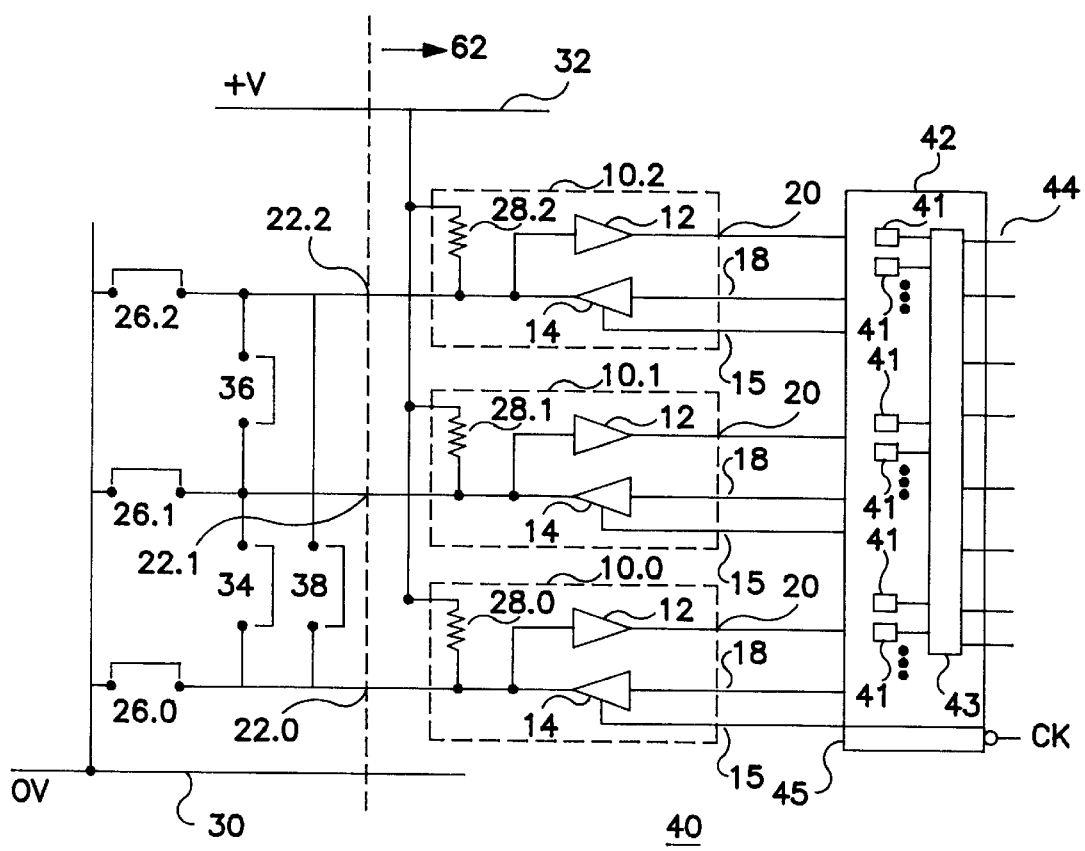
FIG. 2 is a schematic diagram of an embodiment of the invention having three binary input stages.

FIG. 2 illustrates an embodiment 40 of the invention employing three input stages 10 as shown in FIG. 1. As described above for FIG. 1, the configuration shown is for illustrative purposes only and may be varied. Three inputs 22.0, 22.1 and 22.2 are provided for each of the input stages 10.0, 10.1 and 10.2, respectively. In FIG. 2, the same arrangement shown in FIG. 1 is provided, with resistive elements 28.0, 28.1 and 28.2 being provided for pins 22.0, 22.1 and 22.2, respectively. Similarly, positions for jumpers at 26.0, 26.1 and 26.2 are provided for each of the pins 22.0, 22.1 and 22.2, respectively. Additionally shown in FIG. 2 are connection points for a jumper 34 between pins 22.0 and 22.1, connection points for a jumper 36 between pins 22.1 and 22.2 and connection points for a jumper 38 between pins 22.0 and 22.2. In the embodiment shown in FIG. 2, the resistors 28.0, 28.1 and 28.2 form part of the each input stage 10.0, 10.1 and 10.2. However, this need not be the case and the resistors could be external to pins 22.0, 22.1 and 22.2.

The jumpers 34, 36 and 38 can be used selectively to connect respective pairs of input pins 22 enabling a significantly larger number of input values to be input than would otherwise be possible with three input pins.

Using a conventional input strategy, three input pins could provide $2^3=8$ input values. However, by selectively connecting the jumpers 34, 36 and 38, a total of 15 values can be provided. With the further use of diode jumpers up to 36 values can be provided.

Table 1 below indicates the fifteen possible values which can be derived on three pins with selective connection of the jumpers 34, 36 and 38.

TABLE 1

| Pins | | | Encoded |
|---|---|---|---|
| 22.2 | 22.1 | 22.0 | value |
| L | L | L | 0 |
| L | L | H | 1 |
| L | H | L | 2 |
| L | H | H | 3 |
| H | L | L | 4 |
| H | L | H | 5 |
| H | H | L | 6 |
| H | H | H | 7 |
| L | C | C | 8 |
| H | C | C | 9 |
| C | C | L | 10 |
| C | C | H | 11 |
| C | L | C | 12 |
| C | H | C | 13 |
| C | C | C | 14 |

The encoded values 0–7 are those which are conventionally available without any of the jumpers 34, 36 and 38 in place.

Encoded values 8 and 9 can be obtained, for example, by having jumper 34 in place connecting pins 22.0 and 22.1 (represented by XCC in Table 1, where X=H or L), with value 8 being represented by jumper 26.2 in place and value 9 by jumper 26.2 being absent. Similarly, encoded values 10 and 11 can be obtained, for example, by having jumper 36 in place connecting pins 22.1 and 22.2 (represented by CCX in Table 1, where X=H or L), with value 10 being obtained with jumper 26.0 in place and value 11 being obtained with jumper 26.0 being absent. Similarly, values 12 and 13 can be obtained, for example, by having jumper 38 in place connecting pins 22.0 and 22.2 (represented by CXC in Table 1, where X=H or L), with value 12 being obtained with jumper 26.1 in place and value 13 being obtained with jumper 26.1 being absent. Value 14 can be obtained by connecting two of the jumpers 34, 38 and 36 such that all three terminals 22.0, 22.1 and 22.2 are connected to each other (represented by CCC in Table 1).

In order to sense the encoding of the jumpers 26.0, 26.1, 26.2, 34, 36 and 38, a two-stage process is employed. This is controlled by input control logic 42 which is responsive to the signals of the outputs 20 of the input buffers 10 and to clock signals CK to generate control signals for controlling the output drivers 14 in the input buffer stages 10. The input control logic 42 can be software logic operating on computer or microcontroller hardware, or could be hard-wired or hardware control logic.

As shown in FIG. 1, the output signals at the output 20 from the input stages 10 are supplied to the input control logic 42 for generating output signals 44.

Figure 3:
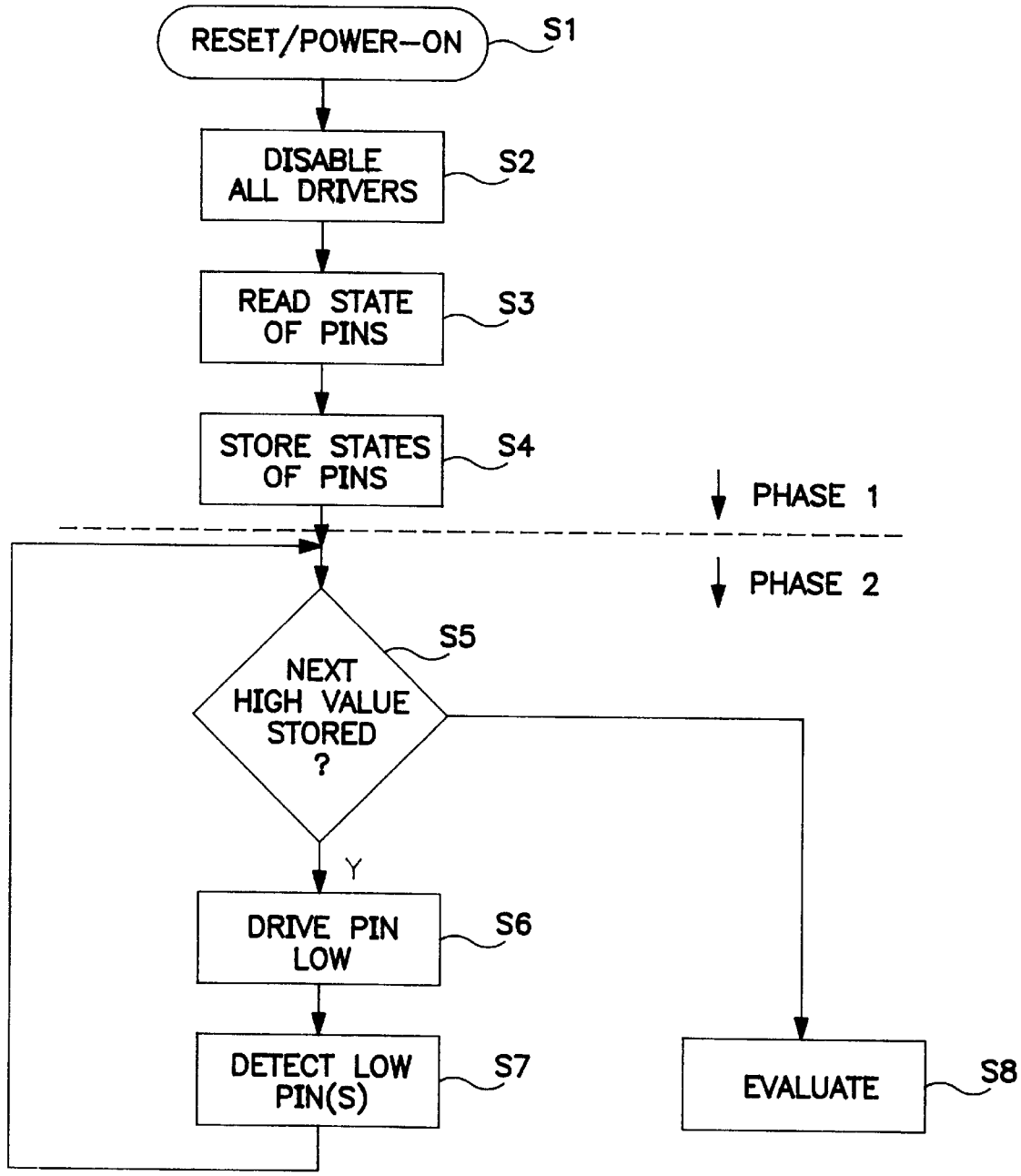
FIG. 3 is a flow diagram illustrating the operation of the input stage of FIG. 1.

FIG. 3 is a flow diagram illustrating the basic operation of the input control logic 42. The process illustrated in FIG. 3 commences at reset/power-on in step S1.

In step S2, all pins are set as inputs.

In step S3, the state of the input pins is read using the input buffers 12 in the input stages 10. The outputs Y of the input buffers 12 are supplied to the input control logic 42 where they are stored in step S4. Steps S1–S4 form phase 1.

In step S5, if there is a high output value pin for which a high value has been stored, the input control logic 42 drives the pin low in step S6 by supplying a low signal to the output driver 14 of the relevant input pin and supplying an enable signal to activate the output driver concerned. In step S7, all output values having a low output, where the output for the pin concerned was previously high, are noted as being connected to the output pin currently being driven low. Steps S5–S7 are repeated until each output pin having a high value has been tested. Steps S5–S7 form phase 2.

In step S8, the input control logic 42 evaluates the values output from the second phase of processing. If in the second phase, the binary values 000, 001, 010 or 100 are read, then no further processing is required as the connected pins always read as 1. These encodings always have only one bit that reads one so that the lines concerned cannot be connected to anything.

If, however, in the second phase, the binary values 011, 101 or 110 are read, and if either of the one bits is driven to zero and the value 000 is read, then the two one bits are connected and the pins evaluate to 0CC, C0C or CC0, respectively. If 000 is not read, then the pins evaluate to 011, 101 and 110, respectively. It is to be noted that if a pin is being driven to zero, it is assumed that when the pin is read, it will read as zero.

If at stage 2 the binary value 111 is read, then Table 2 below shows all the pin values that can result as each pin is driven low in turn.

TABLE 2

| Pin Driven | | | Evaluated |
|---|---|---|---|
| A | B | C | value |
| 011 | 101 | 110 | 111 |
| 010 | 101 | 010 | C1C |
| 001 | 001 | 110 | CC1 |
| 011 | 100 | 100 | 1CC |
| 000 | 000 | 000 | CCC |

The input control logic 42 can be configured in any suitable manner to provide various evaluating steps described with reference to FIG. 3. As mentioned above, the input control logic can be implemented by software (e.g., embedded software) executed in a microcontroller or microprocessor of which the input stages form part. Alternatively, special purpose control logic in the form of an ASIC, or the like, can be employed. The control logic 42 can include registers 41 which are clocked by timing logic 45 for storing the respective values sensed during the first and second phases and mapping logic 43 (e.g. a look-up table) for mapping sensed values to evaluated values according to the mappings illustrated in Tables 1 and 2. The timing logic and the mapping logic can form part of the input control logic 42 as represented in FIG. 2. The various registers 41 can be dynamically allocated by the input control logic 42, or can be hardwired registers which are clocked by timing signals (not shown) from the timing logic 45. The input control logic 42, whether implemented by special purpose logic or by software logic causes the output of the ENABLE signals and the logic low signal for the respective output drivers 14 at appropriate timings.

Figure 4:
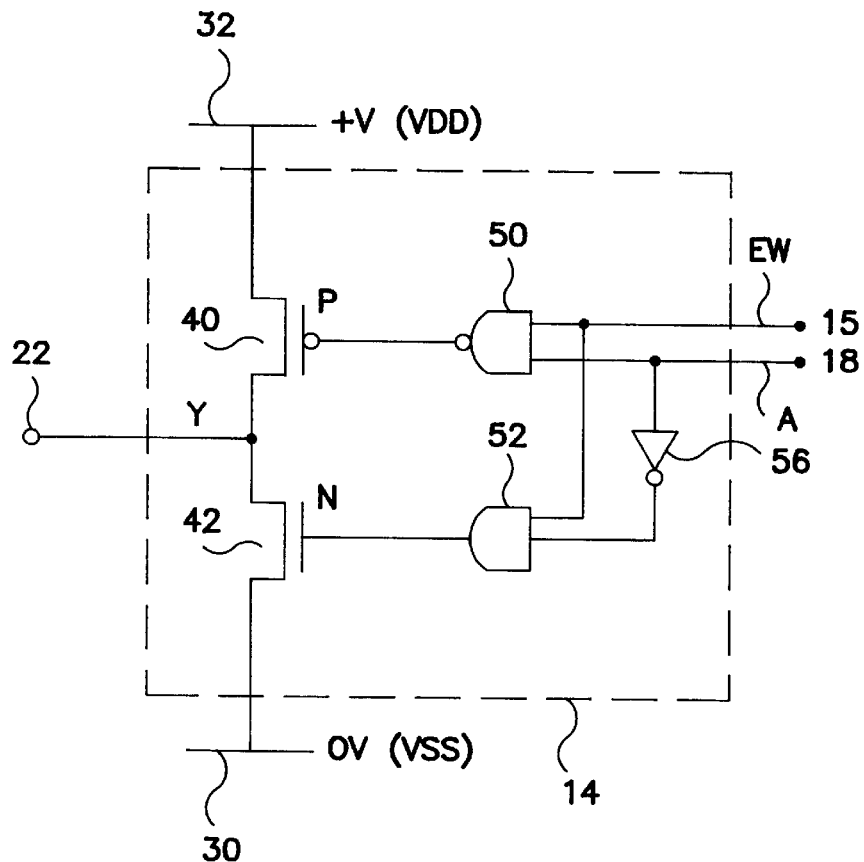
FIG. 4 is a schematic diagram of an output driver of the input stage of FIG. 1.

FIG. 4 is a schematic diagram illustrating an example of a circuit suitable for implementing the output driver 14. The circuit comprises a first CMOS drive transistor 40 and a second CMOS drive transistor 42 connected in series between a high potential source 32 (e.g. a high potential rail 5 V) and a low potential source 30 (e.g. a low potential rail). Between the first drive transistor 40 and the high potential source 32, a current limiter represented by a resistor 46 is provided. The drive transistors 40 and 42 could be implemented in any desired technology. In a preferred embodiment of the invention illustrated in FIG. 3, the first and second transistors are implemented by a PMOS and an NMOS field effect transistor, respectively.

The A input of the output driver 14 is connected to a NAND gate 50 and via an inverter 56 to an AND gate 52. The ENABLE input is connected to a second input of both the AND gate 52 and the NAND gate 50. The output of the AND gate 52 is connected to the gate of the first driver transistor 42 and the output of the NAND gate 50 is connected to the gate of the second driver transistor 40. The output Y of the output driver 14 is connected to the pin 22. The operation of the output driver 14 is that when a low signal is provided at the input A and the ENABLE signal is high, a high signal is output by the AND gate 52 causing the second (NMOS) drive transistor 42 to be turned on. A high output is also supplied from the NAND gate 50 which causes the first (PMOS) transistor 40 to be turned off. As a result, the output Y of the output driver, and consequently the pin 22, are driven low.

Figure 5:
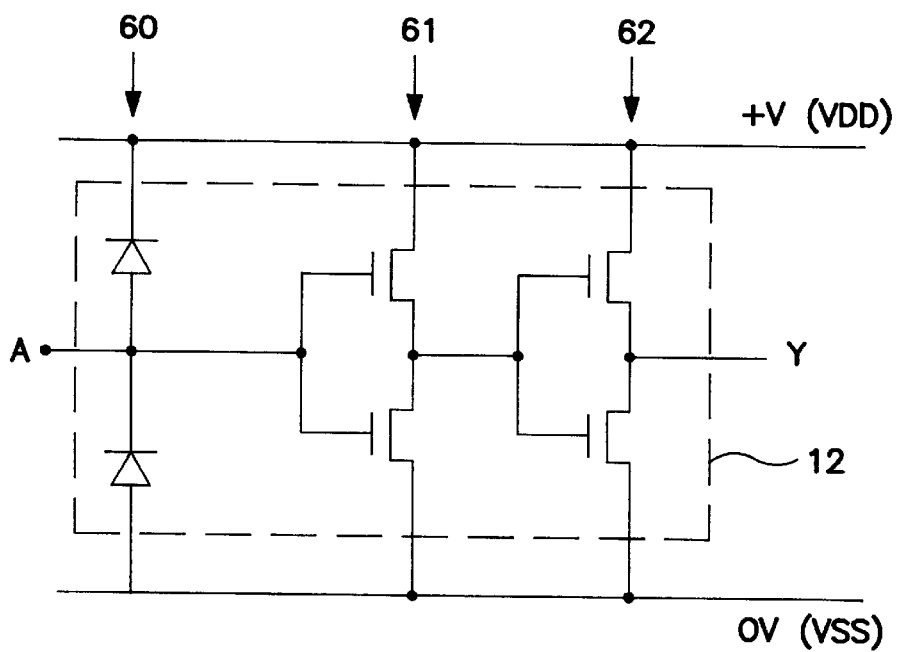
FIG. 5 is a schematic diagram of an input buffer of the input stage of FIG. 1.

FIG. 5 is a schematic representation of an input buffer 12, which comprises a diode protection stage 60 between the high potential supply 32 and the low potential source 30 and first and second CMOS inverter stages 61 and 62. The input buffer 14 can be implemented using any appropriate technology. In the present preferred embodiment, CMOS technology is used.

As described above, an encoding of 15 values is possible with three pins through the use of jumpers providing omni-, or more correctly bidirectional connections. However, even more input values (up to 36) can be provided by additionally using unidirectional connection between input pins. In this case no additional hardware (apart from, for example, diodes for the unidirectional connections) are needed, rather the evaluation of the inputs sensed during the first and second stages becomes more complicated. This does not, however, become significantly more complicated and the evaluation can be performed using suitable logic (for example embedded software implementing a look-up table).

Three extended binary inputs with single diode or single link connections could be evaluated as follows:

If at stage 2 the binary values: 000, 001, 010 or 100 are read then no further processing is required since connected pins always read as 1. These encodings have only one bit that reads as 1 so it cannot be connected to anything.

If at stage 2 the binary values 011, 101 or 110 are read: if either of the 1 bits is driven to 0 and the value 000 is read then the two 1 bits are connected either directly or via a diode (see Table 3). If 000 is not read then the pins evaluate to 011, 101 and 110 respectively. Note that if a pin is being driven to 0 it is assumed that when the pin is read, it will read as 0.

TABLE 3

| Pin Driven | | | Evaluated |
|---|---|---|---|
| A | B | C | value |
| 011 | 001 | 010 | 011 |
| 011 | 000 | 010 | 0KA |
| 011 | 001 | 000 | 0AK |
| 011 | 000 | 000 | 0CC |
| 001 | 101 | 100 | 101 |
| 000 | 101 | 100 | K0A |
| 001 | 101 | 000 | A0K |
| 000 | 101 | 000 | C0C |
| 010 | 100 | 110 | 110 |
| 000 | 100 | 110 | KA0 |
| 010 | 000 | 110 | AK0 |
| 000 | 000 | 110 | CC0 |

In Table 3 and the following Tables, K represents the cathode of a diode and A the anode.

If at stage 2 the binary value 111 is read, then Table 4 below shows all the pin values that can result as each pin is driven low in turn (assuming a single diode or single link is used).

TABLE 4

| Pin Driven | | | Evaluated |
|---|---|---|---|
| A | B | C | value |
| 011 | 101 | 110 | 111 |
| 010 | 101 | 010 | C1C |
| 001 | 001 | 110 | CC1 |
| 011 | 100 | 100 | 1CC |
| 011 | 100 | 110 | 1KA |
| 011 | 101 | 100 | 1AK |
| 011 | 001 | 110 | AK1 |
| 001 | 101 | 110 | KA1 |
| 011 | 101 | 010 | A1K |
| 010 | 101 | 110 | K1A |

Using two diodes (common cathode arrangement only) or two links, at stage 2 the binary value 111 will always be read. Table 5 below shows all the pin values that can result as each pin is driven low in turn.

TABLE 5

| Pin Driven | | | Evaluated |
|---|---|---|---|
| A | B | C | value |
| 000 | 000 | 000 | CCC |
| 000 | 101 | 110 | KAA |
| 011 | 000 | 110 | AKA |
| 011 | 101 | 000 | AAK |

Using two diodes in series ie -AK-AK- (AXK) gives some further options, a potential drawback to this is that if the forward voltages of the diodes is too large then illegal Low values may result. This may be overcome by using Schottky diodes with a low forward voltage (Vf) or by using inputs with CMOS thresholds instead of TTL (or both). If two diodes in a series arrangement are used, the binary value 111 will be read. Table 6 below shows all the pin values that can result as each pin is driven Low in turn.

TABLE 6

| Pin Driven | | | Evaluated |
|---|---|---|---|
| A | B | C | value |
| 011 | 001 | 000 | AXK |
| 000 | 100 | 110 | KXA |
| 011 | 000 | 010 | AKX |
| 000 | 101 | 100 | KAX |
| 010 | 000 | 110 | XKA |
| 001 | 101 | 000 | XAK |

Figure 6:
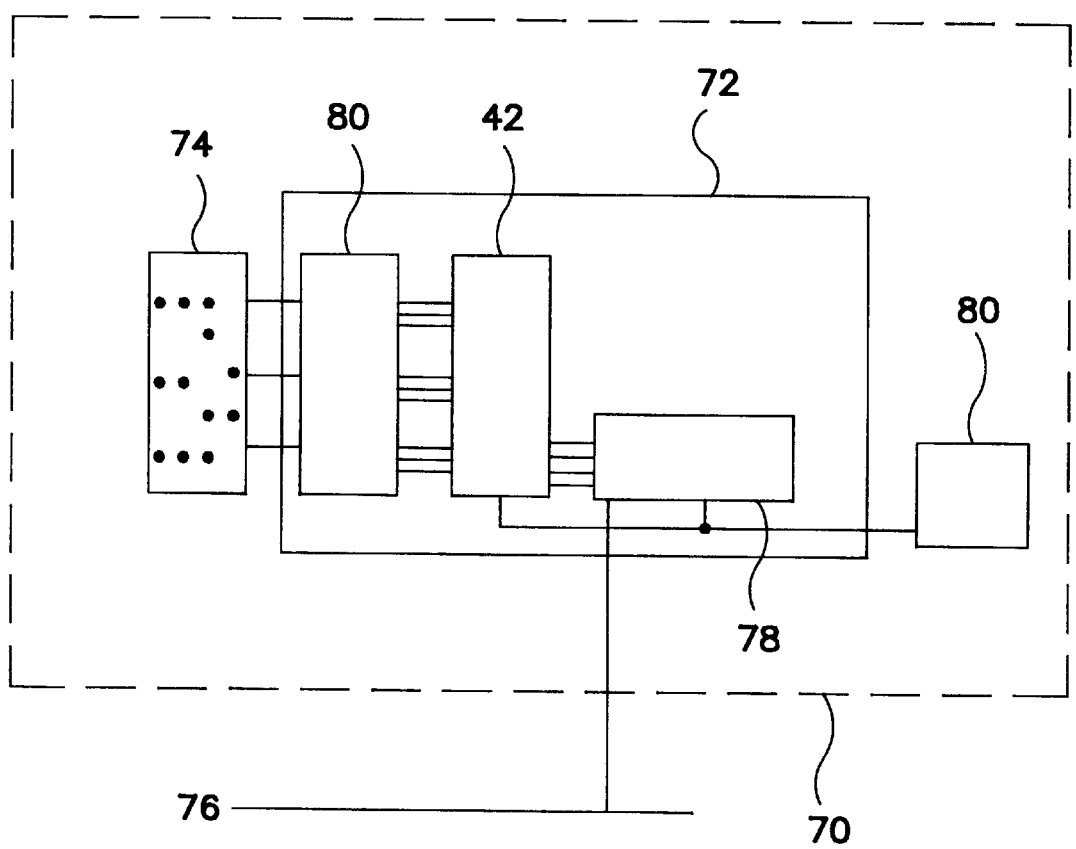
FIG. 6 is a schematic representation of a microcontroller employing input apparatus according to the invention.

FIG. 6 is a schematic representation of a system 70 incorporating an input arrangement. The system can, for example, comprise a microcontroller 72 with a jumper terminal array 74 for presetting values for the microcontroller. The microcontroller could, for example, form a communications controller for connection to a communications medium 76. The array 74 of jumper terminals can be used for selecting an input address for address decoding circuitry 78 of the microcontroller 72. The microcontroller 72 includes an input decoder 80 including a plurality of input stages corresponding to stages 10.0–10.2 of FIG. 2 for respective inputs 22.0. 22.1 and 22.2 and input control logic 42. An array of jumper terminals is provided for selective application of jumpers 26.0–26.2, 34, 36 and 38 for encoding an address for the microcontroller 72. Timing circuitry 80 can be provided internally to the microcontroller or externally thereto for supplying clock signals to the input control logic 42 for controlling the generation of the ENABLE signal for controlling the first and second phases of operation, either on power-on or reset, or possibly also subsequent to power-on or reset.

Although particular embodiments of the invention have been described, it will be appreciated that the invention is not limited thereto, and many modifications and/or additions may be made within the spirit and scope of the invention as defined in the appended Claims. For example, different combinations of the features of the dependent Claims may be combined with the features of any of the independent Claims.

For example, it will be appreciated that the provision of three pins with associated input stages is merely one example for illustrative purposes. In other embodiments of the invention any appropriate number of input pins with corresponding input stages and pin interconnection possibilities can be provided. In view of the description above of an implementation for three pins, the encoding can readily be modified to provide an encoding for two pins, or for a higher number of pins than three.

Also, it will be understood that the particular circuit configurations shown are also merely illustrative. For example the input stages could have a different construction, using different input buffer and output driver configurations, or different circuit technology, for example.

What is claimed is:

1. Extended binary input apparatus comprising a plurality of inputs and input control logic configured to be operable in a two phases, whereby said input control logic is operable in a first phase to detect a predetermined signal level at said inputs, and is operable in a second phase to drive a said input having said predetermined signal level to another signal level and to detect a change in signal level at another of said inputs as indicative a connection between said inputs representative of an extended binary encoding.

2. Extended binary input apparatus comprising a plurality of input stages and input control logic, wherein each input stage comprises:

an input for a binary input signal having first and second binary signal values, an input buffer for sensing a said binary signal value at said input; and an output driver responsive to a control signal from said input control logic to drive said input to said second binary signal value; and said input control logic is configured:

during a first phase to be responsive to binary signal values sensed at said input stages; and during a second phase, for a said input stage at which said first binary signal value is sensed, to cause said output driver for said input stage to drive said input to said second binary signal value and to respond to said second binary signal value being sensed at one or more other input stage or stages which had said first binary signal value in said first phase as indicative of a connection between said driven and said other input and representative of an extended binary encoding.

3. Apparatus according to claim 2, wherein said input control logic is configured, during said second phase, for successive input stages for which a first binary signal value is sensed sequentially to drive said input of said input stages to said second binary signal value and to respond to said second binary signal value being sensed at one or more other input stages which had said first binary signal value in said first phase as indicative of a connection between said driven and said other input and representative of an extended binary encoding.

4. Apparatus according to claim 2, comprising a connection for each input via a respective impedance to a first potential supply for supplying said first binary signal value and a selectable connection to a second supply potential for selectively supplying said second binary signal value.

5. Apparatus according to claim 4, comprising selectable connection(s) between said inputs for said extended binary encoding.

6. Apparatus according to claim 5, wherein said selectable connection(s) include jumpers.

7. Apparatus according to claim 2, wherein said selectable connections include unidirectional connections.

8. Apparatus according to claim 7, wherein said first signal value is a high potential value and said second value is a low potential value.

9. Apparatus according to claim 2, wherein said first binary signal value is a low potential value and said second binary signal value is a high potential value.

10. Apparatus according to claim 2, wherein said input control logic comprises mapping logic for deriving an encoded value from said sensed values.

11. Apparatus according to claim 10, wherein said mapping logic comprises a look-up table connected to receive said binary signal values sensed during said first and second phase for determining said encoded value.

12. Apparatus according to claim 2 in the form of an integrated circuit, wherein each input is a pin of said integrated circuit.

13. Apparatus according to any preceding claim, wherein said input control logic comprises software logic.

14. An integrated circuit comprising a plurality of pins, a plurality of input stages, each associated with a respective pin, and input control logic, wherein each input stage comprises:

an input buffer for sensing either a first binary signal value or a second binary signal value at said respective pin; and an output driver responsive to a control signal from said input control logic to drive said respective pin to said second binary signal value; and said input control logic is configured:

during a first phase to determine the binary signal values sensed at said input pins; and during a second phase to cause said output driver at selected input stages to drive said respective pins to said second value and to respond to said second binary signal value being sensed at one or more other pins which had said first binary signal value in said first phase as indicative of a connection between said driven and said other input and representative of an extended binary encoding.

15. An integrated circuit according to claim 14, wherein said input control logic is configured, during said second phase, for successive input stages for which a first binary signal value is sensed sequentially to drive said pin of said input stages to said second binary signal value and to respond to said second binary signal value being sensed at one or more other pins which had said first binary signal value in said first phase as indicative of a connection between said driven and said other input and representative of an extended binary encoding.

16. An integrated circuit according to claim 14, wherein said first signal value is a high potential value and said second value is a low potential value.

17. An integrated circuit according to claim 13, wherein said first binary signal value is a low potential value and said second binary signal value is a high potential value.

18. An integrated circuit according to claim 17, comprising mapping logic for deriving an encoded value from said sensed values.

19. An integrated circuit according to claim 18, wherein said mapping logic comprises a look-up table connected to receive said binary signal values sensed during said first and second phase for determining said encoded value.

20. Software control logic on a data carrier for controlling the input of values to a circuit comprising a plurality of inputs for receiving either a first or a second binary signal value, said control logic being configured to be operable:

in a first phase to record a predetermined signal level sensed at said inputs; and in a second phase to cause a said input having said predetermined signal level to be driven to another signal level and to respond to sensing of a change in signal level at another of said inputs as indicative a connection between said inputs representative of an extended binary encoding.

21. A method for inputting values to a circuit comprising a plurality of inputs for receiving either a first or a second binary signal value, the method comprising steps of:

a) in a first phase,
   i) sensing said binary signal values at said inputs representative of a binary encoding; and, b) in a second phase,
   i) driving an input having said first binary signal value in said first phase to said second binary signal value, and
   ii) responding to said second binary signal value sensed at another input or inputs which had said first binary signal value in said first phase as indicative of a connection between said driven and said another input and representative of an extended binary encoding.

22. A method according to claim 21, wherein step (b) is repeated for successive input stages which had said first binary signal value in said first phase.

23. A method according to claim 21, wherein steps (a) and (b) are performed at power-on or reset of said circuit.

24. A method according to claim 21, wherein each input is connected to a first potential value via an impedance representative of said first binary value and said method comprises a step prior to step (a) of:

connecting selected inputs to a second potential value to change the value of said selected inputs from said first to said second input values, and selectively connecting inputs together to provide an extended binary input encoding.

25. A method according to claim 24, wherein said selective connection(s) are made by jumpers.

26. A method according to claim 25, wherein said selective connection(s) are made by unidirectional connections.

27. A method according to claim 24, wherein said selective connection(s) are changed after power-on or reset of said circuit.

28. A method according to claim 27, wherein steps (a) and (b) are performed repeatedly following power-on or reset of said circuit.

29. A method according to claim 21, wherein said first signal value is a high potential value and said second value is a low potential value.

30. A method according to claim 21, wherein said first binary signal value is a low potential value and said second binary signal value is a high potential value.

31. A method according to claim 21, comprising performing a mapping based on said sensed values during steps (a) and (b) to derive an encoded value from said sensed values.

32. A method according to claim 21, wherein said circuit is an integrated circuit.

* * * * *